(12) United States Patent
Sturgeon et al.

(10) Patent No.: US 12,219,322 B2
(45) Date of Patent: *Feb. 4, 2025

(54) ESTIMATING A BATTERY LIFE OF A HEARING INSTRUMENT

(71) Applicant: Starkey Laboratories, Inc., Eden Prairie, MN (US)

(72) Inventors: Brantly Sturgeon, Burnsville, MN (US); Dustin Degen, Waconia, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,012

(22) Filed: Aug. 21, 2023

(65) Prior Publication Data

US 2023/0396935 A1 Dec. 7, 2023

Related U.S. Application Data

(63) Continuation of application No. 17/443,739, filed on Jul. 27, 2021, now Pat. No. 11,792,576.

(60) Provisional application No. 63/058,158, filed on Jul. 29, 2020.

(51) Int. Cl.
| | | |
|---|---|---|
| *H04R 25/00* | (2006.01) | |
| *G01R 31/3835* | (2019.01) | |
| *G01R 31/396* | (2019.01) | |
| *H02J 7/00* | (2006.01) | |

(52) U.S. Cl.
CPC ......... *H04R 25/30* (2013.01); *G01R 31/3835* (2019.01); *G01R 31/396* (2019.01); *H04R 25/558* (2013.01); *H04R 25/602* (2013.01); *H02J 7/0048* (2020.01); *H04R 2225/39* (2013.01); *H04R 2225/55* (2013.01)

(58) Field of Classification Search
CPC .... H04R 25/30; H04R 25/558; H04R 25/602; H04R 2225/021; H04R 2225/023; H04R 2225/025; H04R 2225/31; H04R 2225/39; H04R 2225/55
USPC ......................................................... 381/60
See application file for complete search history.

(56) References Cited

U.S. PATENT DOCUMENTS

| | | |
|---|---|---|
| 6,711,271 B2 | 3/2004 | Hou |
| 9,235,704 B2 | 1/2016 | Wootton et al. |
| 11,528,566 B2 | 12/2022 | Weispfenning et al. |
| 2004/0017180 A1 | 1/2004 | Cook |
| 2012/0130660 A1 | 5/2012 | Neumeyer |
| 2019/0157891 A1 | 5/2019 | Chemali et al. |

(Continued)

FOREIGN PATENT DOCUMENTS

WO 2011159349 A1 12/2011

OTHER PUBLICATIONS

Notice of Allowance from U.S. Appl. No. 17/443,739 dated May 17, 2023, 9 pp.

*Primary Examiner* — Phylesha Dabney
(74) *Attorney, Agent, or Firm* — Shumaker & Sieffert, P.A.

(57) ABSTRACT

A processing system determines, based on a set of input datapoints, a current state of charge (SOC) of a battery of a hearing instrument. Additionally, the processing system determines a predicted agenda of the hearing instrument, the predicted agenda comprising one or more future time segments. The processing system estimates, based on the current state of charge and the predicted agenda of the hearing instrument, an amount of time remaining until the future SOC of the battery of the hearing instrument reaches a threshold.

20 Claims, 6 Drawing Sheets

(56) References Cited

U.S. PATENT DOCUMENTS

2019/0386498 A1 12/2019 Higgins et al.
2022/0038827 A1 2/2022 Degen et al.
2023/0010213 A1 1/2023 Roth

ESTIMATING A BATTERY LIFE OF A HEARING INSTRUMENT

This application is a continuation of U.S. patent application Ser. No. 17/443,739, filed Jul. 27, 2021, which claims the benefit of U.S. Provisional Patent Application 63/058,158, filed Jul. 29, 2020, the entire content of each of which is incorporated by reference.

TECHNICAL FIELD

This disclosure relates to hearing instruments.

BACKGROUND

Hearing instruments are devices designed to be worn on, in, or near one or more of a user's ears. Common types of hearing instruments include hearing assistance devices (e.g., "hearing aids"), earbuds, headphones, hearables, cochlear implants, and so on. In some examples, a hearing instrument may be implanted or integrated into a user. Some hearing instruments include additional features beyond just environmental sound-amplification. For example, some modern hearing instruments include advanced audio processing for improved device functionality, controlling and programming the instruments, and beamforming, and some can even communicate wirelessly with external devices including other hearing instruments (e.g., for streaming media).

SUMMARY

This disclosure describes techniques for estimating a battery life of a battery of a hearing instrument. As described herein, a processing system may determine, based on a set of input datapoints, a current state of charge (SOC) of a battery of a hearing instrument. Additionally, the processing system may determine a predicted agenda for the hearing instrument. The predicted agenda comprises one or more future time segments and each of the future time segments corresponds to a device state of the hearing instrument in a plurality of possible device states. Furthermore, the processing system may estimate, based on the current state of charge and the predicted agenda, an amount of time remaining until a future SOC of the battery of the hearing instrument reaches a threshold, e.g., drops to or below a threshold charge level.

In one example, this disclosure describes a method comprising: determining, by a processing system, based on a set of input datapoints, a current state of charge (SOC) of a battery of a hearing instrument; determining, by the processing system, a predicted agenda for the hearing instrument, wherein the predicted agenda comprises one or more future time segments and each of the future time segments corresponds to a device state of the hearing instrument in a plurality of possible device states; and estimating, by the processing system, based on the current state of charge and the predicted agenda, an amount of time remaining until a future SOC of the battery of the hearing instrument reaches a threshold.

In another example, this disclosure describes a system comprising: a hearing instrument comprising a battery; and a processing system configured to: determine, based on a set of input datapoints, a current state of charge (SOC) of the battery of the hearing instrument; determine, a predicted agenda for the hearing instrument, wherein the predicted agenda comprises one or more future time segments and each of the future time segments corresponds to a device state of the hearing instrument in a plurality of possible device states; and estimate, based on the current state of charge and the predicted agenda, an amount of time remaining until a future SOC of the battery of the hearing instrument reaches a threshold.

In another example, this disclosure describes a computer-readable medium comprising instructions that, when executed, cause a processing system to: determine, based on a set of input datapoints, a current state of charge (SOC) of a battery of a hearing instrument; determine a predicted agenda for the hearing instrument, wherein the predicted agenda comprises one or more future time segments and each of the future time segments corresponds to a device state of the hearing instrument in a plurality of possible device states; and estimate, based on the current state of charge and the predicted agenda, an amount of time remaining until a future SOC of the battery of the hearing instrument reaches a threshold.

In another example, this disclosure describes a system comprising: means for determining, based on a set of input datapoints, a current state of charge (SOC) of a battery of a hearing instrument; means for determining a predicted agenda for the hearing instrument, wherein the predicted agenda comprises one or more future time segments and each of the future time segments corresponds to a device state of the hearing instrument in a plurality of possible device states; and means for estimating, based on the current state of charge and the predicted agenda, an amount of time remaining until a future SOC of the battery of the hearing instrument reaches a threshold.

The details of one or more aspects of the disclosure are set forth in the accompanying drawings and the description below. Other features, objects, and advantages of the techniques described in this disclosure will be apparent from the description, drawings, and claims.

DETAILED DESCRIPTION

Modern hearing instruments, such as hearing aids, are typically powered by rechargeable batteries. As a user uses a hearing instrument, power from a battery of the hearing instrument is discharged, eventually resulting in a state in which the battery no longer has enough stored energy to power the hearing instrument. In other words, a state of charge (SOC) of the battery of the hearing instrument may reach a threshold below which the battery can no longer provide power to sustain present operations of the hearing instrument. Such a threshold may be referred to as an exhaustion threshold. The SOC of a battery is a measure of the amount of dispatchable energy stored in the battery. For instance, the SOC of the battery may be a percentage of the amount of dispatchable energy stored in the battery as compared to a given upper limit on the amount of dispatchable energy that can be stored by the battery.

The user of the hearing instrument may want to know how much time remains before the SOC of the battery of the hearing instrument reaches the exhaustion threshold. For example, the user may want to know whether the battery has enough stored energy to power the hearing instrument through the rest of the day or other time period.

Estimating the amount of time remaining until a future SOC of the battery of a hearing instrument reaches a particular threshold, such as an exhaustion threshold, presents several challenges. For example, the hearing instrument may draw different amounts of power from the battery of the hearing instrument when the hearing instrument is in different device states. For instance, in this example, the hearing instrument may draw more power when the hearing instrument is in a noisy acoustic environment (and therefore has to provide increased audio volume) than when the hearing instrument is in a quiet acoustic environment. In another example, the hearing instrument may draw more power when the hearing instrument is using a photoplethysmography (PPG) sensor, or other associated sensing devices, of the hearing instrument than when the hearing instrument is not using the PPG sensor. In another example, the hearing instrument may draw more power from the battery when the hearing instrument is using wireless communication to stream audio data, or communicate with other hearing instruments or other devices, than when the hearing instrument is not using wireless communication. In still another example of the challenges associated with estimating the amount of time remaining until the future SOC of the battery of the hearing instrument reaches a particular threshold, the amount of power that the battery can store and discharge may decrease over time as the battery experiences more use.

This disclosure describes techniques that may improve the process of estimating the amount of time remaining until a future SOC of a battery of a hearing instrument reaches a particular threshold. As described herein, a processing system may determine, based on a set of input datapoints, a present SOC of a battery of a hearing instrument. Additionally, the processing system may determine a predicted agenda for the hearing instrument. The predicted agenda comprises one or more future time segments and each of the future time segments corresponds to a device state of the hearing instrument in a plurality of possible device states. In some examples, the one or more time segments include a plurality of time segments. The processing system may estimate, based on the current state of charge and the predicted agenda, an amount of time remaining until a future SOC of the battery of the hearing instrument reaches a threshold, such as an exhaustion threshold or other type of threshold. By estimating the amount of time remaining until the future SOC of the battery of the hearing instrument reaches the exhaustion threshold based on the predicted agenda for the hearing instrument, the processing system may be able to more accurately predict the amount of time remaining until the future SOC of the battery of the hearing instrument reaches the threshold.

Figure 1:
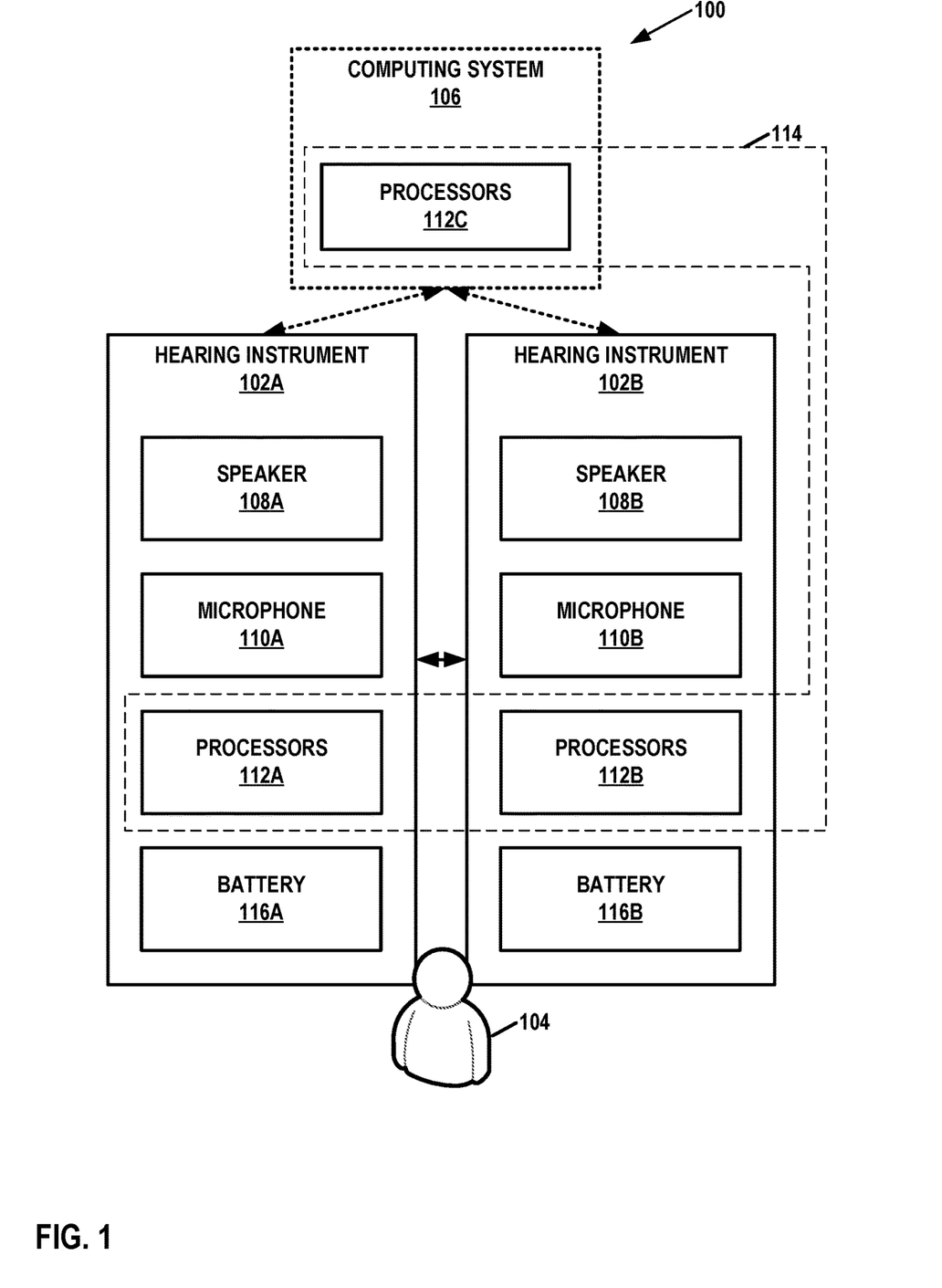
FIG. 1 is a conceptual diagram illustrating an example system that includes one or more hearing instruments, in accordance with one or more techniques of this disclosure.

FIG. 1 is a conceptual diagram illustrating an example system 100 that includes hearing instruments 102A, 102B, in accordance with one or more aspects of this disclosure. This disclosure may refer to hearing instruments 102A and 102B collectively, as "hearing instruments 102." A user 104 may wear hearing instruments 102. In some instances, such as when user 104 has unilateral hearing loss, user 104 may wear a single hearing instrument. In other instances, such as when user 104 has bilateral hearing loss, the user may wear two hearing instruments, with one hearing instrument for each ear of user 104.

Hearing instruments 102 may comprise one or more of various types of devices that are configured to provide auditory stimuli to user 104 and that are designed for wear and/or implantation at, on, or near an ear of user 104. Hearing instruments 102 may be worn, at least partially, in the ear canal or concha. In any of the examples of this disclosure, each of hearing instruments 102 may comprise a hearing assistance device. Hearing assistance devices include devices that help a user hear sounds in the user's environment. Example types of hearing assistance devices may include hearing aid devices, Personal Sound Amplification Products (PSAPs), and so on. In some examples, hearing instruments 102 are over-the-counter, direct-to-consumer, or prescription devices. Furthermore, in some examples, hearing instruments 102 include devices that provide auditory stimuli to user 104 that correspond to artificial sounds or sounds that are not naturally in the user's environment, such as recorded music, computer-generated sounds, sounds from a microphone remote from the user, or other types of sounds. For instance, hearing instruments 102 may include so-called "hearables," earbuds, earphones, or other types of devices. Some types of hearing instruments provide auditory stimuli to user 104 corresponding to sounds from the user's environment and also artificial sounds.

In some examples, one or more of hearing instruments 102 includes a housing or shell that is designed to be worn in the ear for both aesthetic and functional reasons and encloses the electronic components of the hearing instrument. Such hearing instruments may be referred to as in-the-ear (ITE), in-the-canal (ITC), completely-in-the-canal (CIC), or invisible-in-the-canal (IIC) devices. In some examples, one or more of hearing instruments 102 may be behind-the-ear (BTE) devices, which include a housing worn behind the ear that contains electronic components of the hearing instrument, including the receiver (e.g., a speaker). The receiver conducts sound to an earbud inside the ear via an audio tube. In some examples, one or more of hearing instruments 102 may be receiver-in-canal (RIC) hearing-assistance devices, which include a housing worn behind the ear that contains electronic components and a housing worn in the ear canal that contains the receiver.

Hearing instruments 102 may implement a variety of features that help user 104 hear better. For example, hearing instruments 102 may amplify the intensity of incoming sound, amplify the intensity of certain frequencies of the incoming sound, translate or compress frequencies of the incoming sound, and/or perform other functions to improve the hearing of user 104. In some examples, hearing instruments 102 may implement a directional processing mode in which hearing instruments 102 selectively amplify sound originating from a particular direction (e.g., to the front of user 104) while potentially fully or partially canceling sound originating from other directions. In other words, a directional processing mode may selectively attenuate off-axis unwanted sounds. The directional processing mode may help users understand conversations occurring in crowds or other noisy environments. In some examples, hearing instruments 102 may use beamforming or directional processing cues to implement or augment directional processing modes.

In some examples, hearing instruments 102 may reduce noise by canceling out or attenuating certain frequencies.

Furthermore, in some examples, hearing instruments 102 may help user 104 enjoy audio media, such as music or sound components of visual media, by outputting sound based on audio data wirelessly transmitted to hearing instruments 102.

Hearing instruments 102 may be configured to communicate with each other. For instance, in any of the examples of this disclosure, hearing instruments 102 may communicate with each other using one or more wireless communication technologies. Example types of wireless communication technology include Near-Field Magnetic Induction (NFMI) technology, a 900 MHz technology, a BLUETOOTH™ technology, a WI-FI™ technology, audible sound signals, ultrasonic communication technology, infrared communication technology, an inductive communication technology, or another type of communication that does not rely on wires to transmit signals between devices. In some examples, hearing instruments 102 use a 2.4 GHz frequency band for wireless communication. In examples of this disclosure, hearing instruments 102 may communicate with each other via non-wireless communication links, such as via one or more cables, direct electrical contacts, and so on.

As shown in the example of FIG. 1, system 100 may also include a computing system 106. In other examples, system 100 does not include computing system 106. Computing system 106 comprises one or more computing devices, each of which may include one or more processors. For instance, computing system 106 may comprise one or more mobile devices, server devices, personal computer devices, handheld devices, wireless access points, smart speaker devices, smart televisions, medical alarm devices, smart key fobs, smartwatches, smartphones, motion or presence sensor devices, smart displays, screen-enhanced smart speakers, wireless routers, wireless communication hubs, prosthetic devices, mobility devices, special-purpose devices, accessory devices, and/or other types of devices.

Accessory devices may include devices that are configured specifically for use with hearing instruments 102. Example types of accessory devices may include charging cases for hearing instruments 102, storage cases for hearing instruments 102, media streamer devices, phone streamer devices, external microphone devices, remote controls for hearing instruments 102, and other types of devices specifically designed for use with hearing instruments 102. Actions described in this disclosure as being performed by computing system 106 may be performed by one or more of the computing devices of computing system 106. One or more of hearing instruments 102 may communicate with computing system 106 using wireless or non-wireless communication links. For instance, hearing instruments 102 may communicate with computing system 106 using any of the example types of communication technologies described elsewhere in this disclosure.

Furthermore, in the example of FIG. 1, hearing instrument 102A includes a speaker 108A, a microphone 110A, and a set of one or more processors 112A. Hearing instrument 102B includes a speaker 108B, a microphone 110B, and a set of one or more processors 112B. This disclosure may refer to speaker 108A and speaker 108B collectively as "speakers 108." This disclosure may refer to microphone 110A and microphone 110B collectively as "microphones 110." Computing system 106 includes a set of one or more processors 112C. Processors 112C may be distributed among one or more devices of computing system 106. This disclosure may refer to processors 112A, 112B, and 112C collectively as "processors 112." Processors 112 may be implemented in circuitry and may comprise microprocessors, application-specific integrated circuits, digital signal processors, or other types of circuits.

As noted above, hearing instruments 102A, 102B, and computing system 106 may be configured to communicate with one another. Accordingly, processors 112 may be configured to operate together as a processing system 114. Thus, discussion in this disclosure of actions performed by processing system 114 may be performed by one or more processors in one or more of hearing instrument 102A, hearing instrument 102B, or computing system 106, either separately or in coordination.

Figure 2:
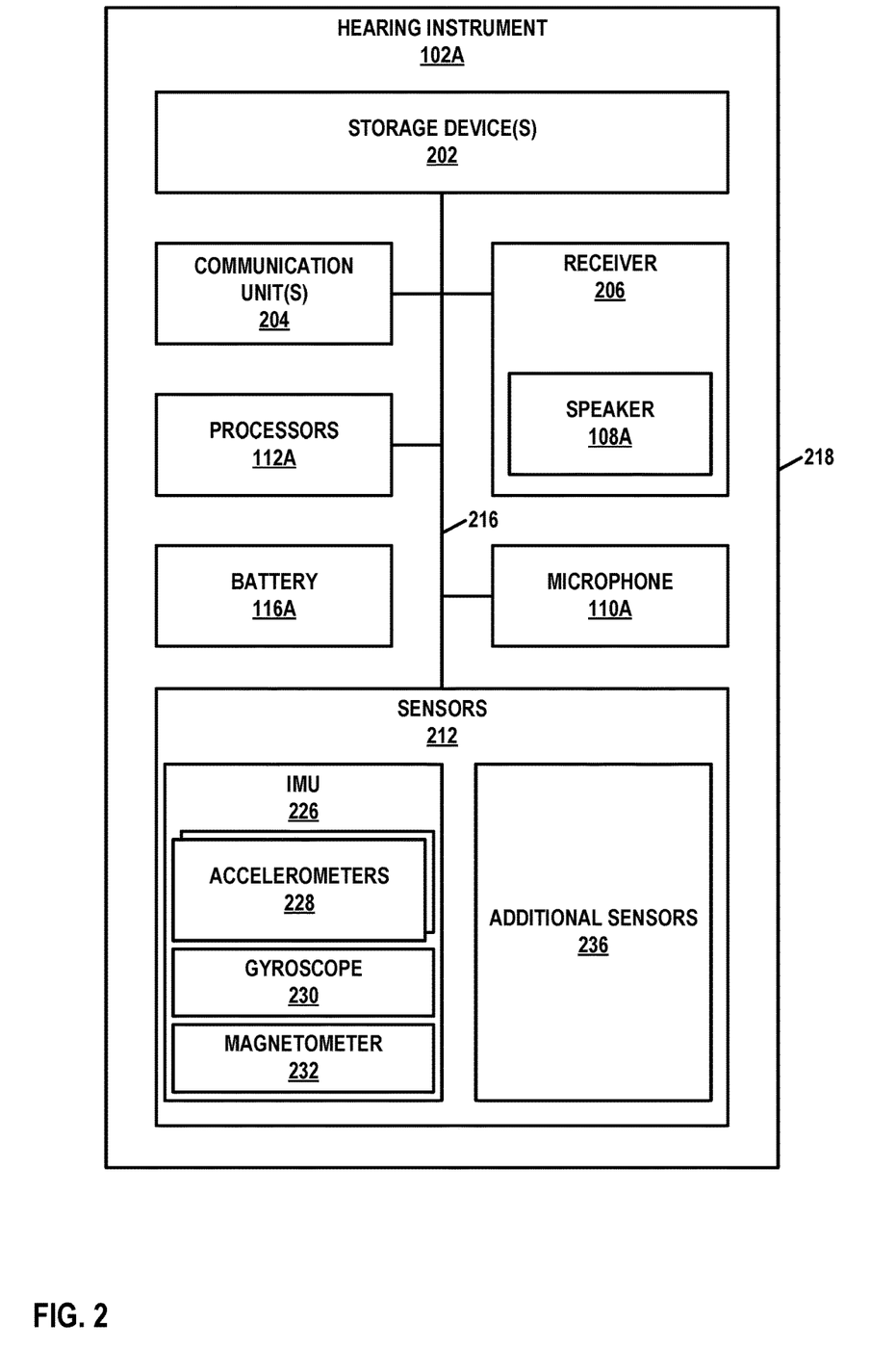
FIG. 2 is a block diagram illustrating example components of a hearing instrument, in accordance with one or more aspects of this disclosure.
Figure 3:
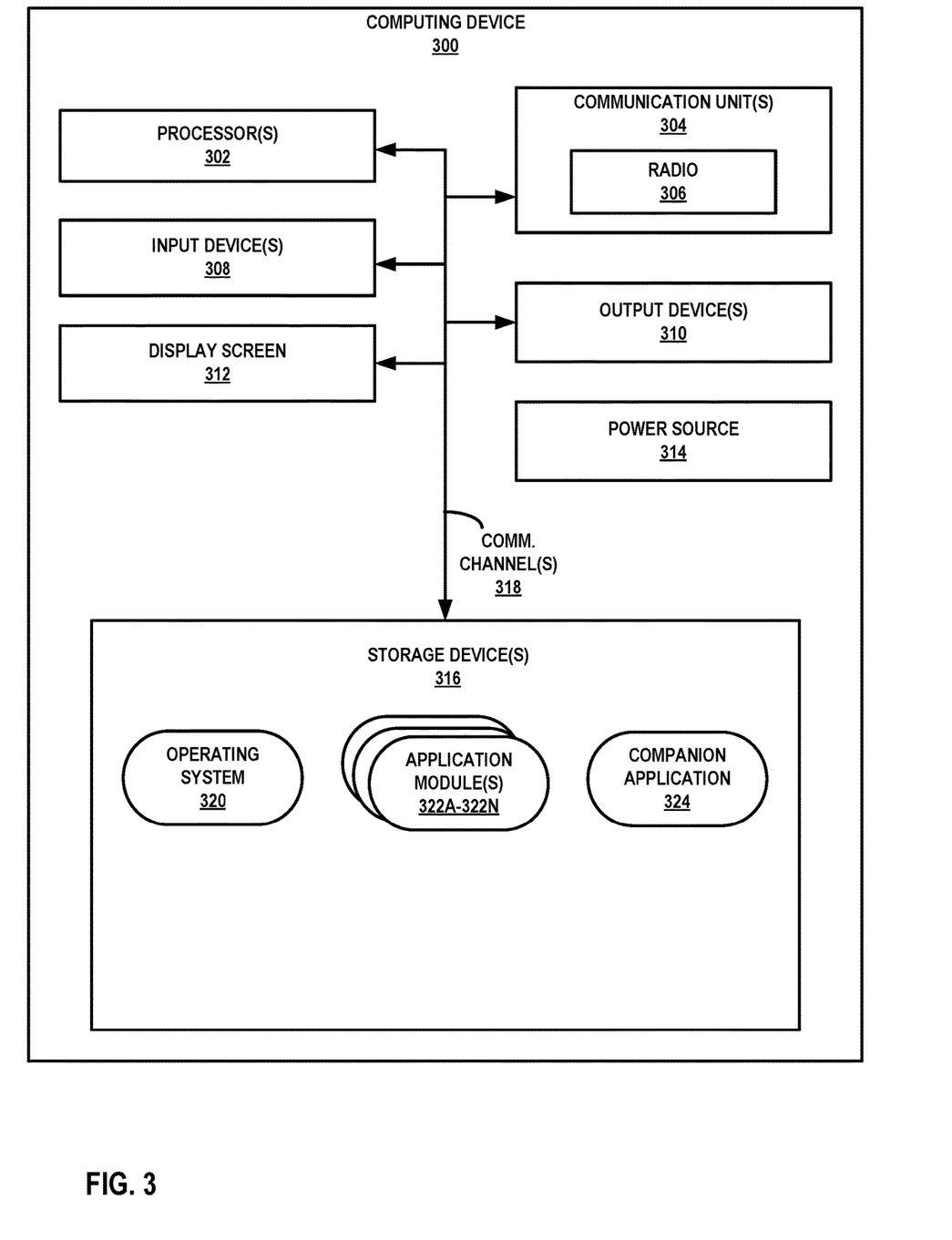
FIG. 3 is a block diagram illustrating example components of a computing device, in accordance with one or more aspects of this disclosure.

It will be appreciated that hearing instruments 102 and computing system 106 may include components in addition to those shown in the example of FIG. 1, e.g., as shown in the examples of FIG. 2 and FIG. 3. For instance, each of hearing instruments 102 may include one or more additional microphones. The additional microphones may include omnidirectional microphones, directional microphones, or other types of microphones. In some examples, hearing instruments 102 may include one or more sensors, such as PPG sensors, temperature sensors, and so on. In some examples, hearing instruments 102 may include inertial measurement units (IMUs).

Speakers 108 may be located on hearing instruments 102 so that sound generated by speakers 108 is directed medially through respective ear canals of user 104. For instance, speakers 108 may be located at medial tips of hearing instruments 102. The medial tips of hearing instruments 102 are designed to be the most medial parts of hearing instruments 102. Microphones 110 may be located on hearing instruments 102 so that microphones 110 may detect sound within the ear canals of user 104.

Furthermore, in the example of FIG. 1, hearing instrument 102A includes a battery 116A and hearing instrument 102B includes a battery 116B. This disclosure may refer to battery 116A and battery 116B collectively as "batteries 116." Batteries 116 store energy and discharge the energy to power various components of hearing instruments 102, such as speakers 108, microphones 110, processors 112, wireless transmitters and receivers, and so on. In some examples, one or more of batteries 116 is rechargeable. In other examples, one or more of batteries 116 is not rechargeable.

In accordance with the techniques of this disclosure, processing system 114 may determine, based on a set of input datapoints, a current state of charge (SOC) of a battery of a hearing instrument, such as hearing instrument 102A or hearing instrument 102B. Additionally, processing system 114 may determine a predicted agenda for the hearing instrument. The predicted agenda comprises one or more future time segments. Each of the future time segments corresponds to a device state of the hearing instrument in a plurality of possible device states. Processing system 114 may estimate, based on the current state of charge and the predicted agenda, an amount of time remaining until a future SOC of the battery of the hearing instrument reaches a threshold, such as an exhaustion threshold or other type of threshold. By estimating the amount of time remaining until the future SOC of the battery of reaches the threshold based on the predicted agenda for the hearing instrument, processing system 114 may be able to more accurately predict the amount of time remaining until the future SOC of the battery of the hearing instrument reaches the threshold.

FIG. 2 is a block diagram illustrating example components of hearing instrument 102A, in accordance with one or more aspects of this disclosure. Hearing instrument 102B may include the same or similar components of hearing instrument 102A shown in the example of FIG. 2. However, for concision, only hearing instrument 102A is described in this disclosure. Thus, the discussion of FIG. 2 with respect to hearing instrument 102A may apply equally to hearing instrument 102B. In the example of FIG. 2, hearing instrument 102A comprises one or more storage devices 202, one or more communication unit(s) 204, a receiver 206, processor 112A, microphone 110A, a set of sensors 212, battery 116A, and one or more communication channels 216. Communication channels 216 provide communication between storage devices 202, communication unit(s) 204, receiver 206, processor(s) 208, a microphone(s) 210, and sensors 212. Communication channels 216 may be implemented as one or more buses or using one or more types of communication technologies. Receiver 206 may include speaker 108A. Components 202, 204, 112A, 108A, 110A, and 212 may draw electrical power from power source 214.

In the example of FIG. 2, each component of hearing instrument 102A is contained within a single housing 218. However, in other examples of this disclosure, the components of hearing instrument 102A may be distributed among two or more housings. For instance, in an example where hearing instrument 102A is a RIC device, receiver 206 and one or more of sensors 212 may be included in an in-ear housing separate from a behind-the-ear housing that contains the remaining components of hearing instrument 102A. In such examples, a RIC cable may connect the two housings.

Furthermore, in the example of FIG. 2, sensors 212 include an inertial measurement unit (IMU) 226 that is configured to generate data regarding the motion of hearing instrument 102A. IMU 226 may include a set of sensors. For instance, in the example of FIG. 2, IMU 226 includes one or more accelerometers 228, a gyroscope 230, a magnetometer 232, combinations thereof, and/or other sensors for determining the motion of hearing instrument 102A. Furthermore, in the example of FIG. 2, hearing instrument 102A may include one or more additional sensors 236. Additional sensors 236 may include a photoplethysmography (PPG) sensor, blood oximetry sensors, blood pressure sensors, electrocardiograph (EKG) sensors, body temperature sensors, electroencephalography (EEG) sensors, environmental temperature sensors, environmental pressure sensors, environmental humidity sensors, skin galvanic response sensors, and/or other types of sensors. In other examples, hearing instrument 102A and sensors 212 may include more, fewer, or different components.

Storage device(s) 202 may store data. Storage device(s) 202 may comprise volatile memory and may therefore not retain stored contents if powered off. Examples of volatile memories may include random access memories (RAM), dynamic random access memories (DRAM), static random access memories (SRAM), and other forms of volatile memories known in the art. Storage device(s) 202 may further be configured for long-term storage of information as non-volatile memory space and retain information after power on/off cycles. Examples of non-volatile memory configurations may include flash memories, or forms of electrically programmable memories (EPROM) or electrically erasable and programmable (EEPROM) memories.

Communication unit(s) 204 may enable hearing instrument 102A to send data to and receive data from one or more other devices, such as a device of computing system 106 (FIG. 1), another hearing instrument (e.g., hearing instrument 102B), an accessory device, a mobile device, or another types of device. Communication unit(s) 204 may enable hearing instrument 102A to use wireless or non-wireless communication technologies. For instance, communication unit(s) 204 enable hearing instrument 102A to communicate using one or more of various types of wireless technology, such as a BLUETOOTH™ technology, 3G, 4G, 4G LTE, 5G, ZigBee, WI-FI™, Near-Field Magnetic Induction (NFMI), ultrasonic communication, infrared (IR) communication, or another wireless communication technology. In some examples, communication unit(s) 204 may enable hearing instrument 102A to communicate using a cable-based technology, such as a Universal Serial Bus (USB) technology.

Receiver 206 comprises one or more speakers for generating audible sound. Microphone 110A detects incoming sound and generates one or more electrical signals (e.g., an analog or digital electrical signal) representing the incoming sound. In some examples, hearing instrument 102A includes multiple microphones.

Processors 112A may be processing circuits configured to perform various activities. For example, processors 112A may process signals generated by microphone 110A to enhance, amplify, or cancel-out particular channels within the incoming sound. Processors 112A may then cause receiver 206 to generate sound based on the processed signals. In some examples, processors 112A include one or more digital signal processors (DSPs). In some examples, processors 112A may cause communication unit(s) 204 to transmit one or more of various types of data. For example, processors 112A may cause communication unit(s) 204 to transmit data to computing system 106. In some examples, processors 112A may read instructions from storage device(s) 202 and may execute instructions stored by storage device(s) 202. Execution of the instructions by processors 112A may configure or cause hearing instrument 102A to provide at least some of the functionality ascribed in this disclosure to hearing instrument 102A. Furthermore, communication unit(s) 204 may receive audio data from computing system 106 and processor(s) 208 may cause receiver 206 to output sound based on the audio data.

Processing system 114 (which may include processors 112A) may determine a present SOC of battery 116A based on a set of input datapoints. Additionally, processing system 114 may determine a predicted agenda for hearing instrument 102A. Processing system 114 may estimate, based on the present SOC of battery 116A and the predicted agenda, an amount of time remaining until a future SOC of battery 116A of hearing instrument 102A reaches a threshold.

In some examples where processors 112C of computing system 106 determine the present SOC of battery 116A, processors 112A may cause communication unit(s) 204 to transmit the input datapoints to computing system 106. Furthermore, in some examples, receiver 206 may output an audible indication of the amount of time remaining until the future SOC of battery 116A reaches a particular threshold, such as an exhaustion threshold, a warning threshold, or another type of threshold.

FIG. 3 is a block diagram illustrating example components of a computing device 300, in accordance with one or more aspects of this disclosure. FIG. 3 illustrates only one particular example of computing device 300, and many other example configurations of computing device 300 exist. Computing device 300 may be a computing device in computing system 106 (FIG. 1).

As shown in the example of FIG. 3, computing device 300 includes one or more processors 302, one or more communication units 304, one or more input devices 308, one or more output devices 310, a display screen 312, a power source 314, one or more storage devices 316, and one or more communication channels 318. Computing device 300 may include other components. For example, computing device 300 may include physical buttons, microphones, speakers, communication ports, and so on.

Communication channel(s) 318 may interconnect each of components 302, 304, 308, 310, 312, and 316 for inter-component communications (physically, communicatively, and/or operatively). In some examples, communication channel(s) 318 may include a system bus, a network connection, an inter-process communication data structure, or any other method for communicating data. Power source 314 may provide electrical energy to components 302, 304, 308, 310, 312 and 316.

Storage device(s) 316 may store information required for use during operation of computing device 300. In some examples, storage device(s) 316 have the primary purpose of being a short term and not a long-term computer-readable storage medium. Storage device(s) 316 may be volatile memory and may therefore not retain stored contents if powered off. Storage device(s) 316 may further be configured for long-term storage of information as non-volatile memory space and retain information after power on/off cycles. In some examples, processor(s) 302 on computing device 300 read and may execute instructions stored by storage device(s) 316.

Computing device 300 may include one or more input device(s) 308 that computing device 300 uses to receive user input. Examples of user input include tactile, audio, and video user input. Input device(s) 308 may include presence-sensitive screens, touch-sensitive screens, mice, keyboards, voice responsive systems, microphones or other types of devices for detecting input from a human or machine.

Communication unit(s) 304 may enable computing device 300 to send data to and receive data from one or more other computing devices (e.g., via a communications network, such as a local area network or the Internet). For instance, communication unit(s) 304 may be configured to receive data exported by hearing instruments 102, receive data generated by user 104 of hearing instruments 102, receive and send request data, receive and send messages, and so on. In some examples, communication unit(s) 304 may include wireless transmitters and receivers that enable computing device 300 to communicate wirelessly with the other computing devices. For instance, in the example of FIG. 3, communication unit(s) 304 include a radio 306 that enables computing device 300 to communicate wirelessly with other computing devices, such as hearing instruments 102 (FIG. 1). Examples of communication unit(s) 304 may include network interface cards, Ethernet cards, optical transceivers, radio frequency transceivers, or other types of devices that are able to send and receive information. Other examples of such communication units may include BLUETOOTH™, 3G, 4G, 5G, and WI-FI™ radios, Universal Serial Bus (USB) interfaces, etc. Computing device 300 may use communication unit(s) 304 to communicate with one or more hearing instruments (e.g., hearing instrument 102 (FIG. 1, FIG. 2)). Additionally, computing device 300 may use communication unit(s) 304 to communicate with one or more other remote devices.

Output device(s) 310 may generate output. Examples of output include tactile, audio, and video output. Output device(s) 310 may include presence-sensitive screens, sound cards, video graphics adapter cards, speakers, liquid crystal displays (LCD), or other types of devices for generating output.

Processor(s) 302 may read instructions from storage device(s) 316 and may execute instructions stored by storage device(s) 316. Execution of the instructions by processor(s) 302 may configure or cause computing device 300 to provide at least some of the functionality ascribed in this disclosure to computing device 300. As shown in the example of FIG. 3, storage device(s) 316 include computer-readable instructions associated with operating system 320, application modules 322A-322N (collectively, "application modules 322"), and a companion application 324. Processor(s) 302 may include processors 112C (FIG. 1) and therefore may form all or part of processing system 114.

Execution of instructions associated with operating system 320 may cause computing device 300 to perform various functions to manage hardware resources of computing device 300 and to provide various common services for other computer programs. Execution of instructions associated with application modules 322 may cause computing device 300 to provide one or more of various applications (e.g., "apps," operating system applications, etc.). Application modules 322 may provide particular applications, such as text messaging (e.g., SMS) applications, instant messaging applications, email applications, social media applications, text composition applications, and so on.

Execution of instructions associated with companion application 324 by processor(s) 302 may cause computing device 300 to perform one or more of various functions. For example, execution of instructions associated with companion application 324 may cause computing device 300 to configure communication unit(s) 304 to receive data from hearing instruments 102 and use the received data to present data to a user, such as user 104 or a third-party user. In some examples, companion application 324 is an instance of a web application or server application. In some examples, such as examples where computing device 300 is a mobile device or other type of computing device, companion application 324 may be a native application. In some examples, companion application 424 may provide information to user 104 regarding a future SOC of a battery of a hearing instrument, a predicted amount of time remaining until the future SOC of the battery reaches a threshold, or other information.

Figure 4:
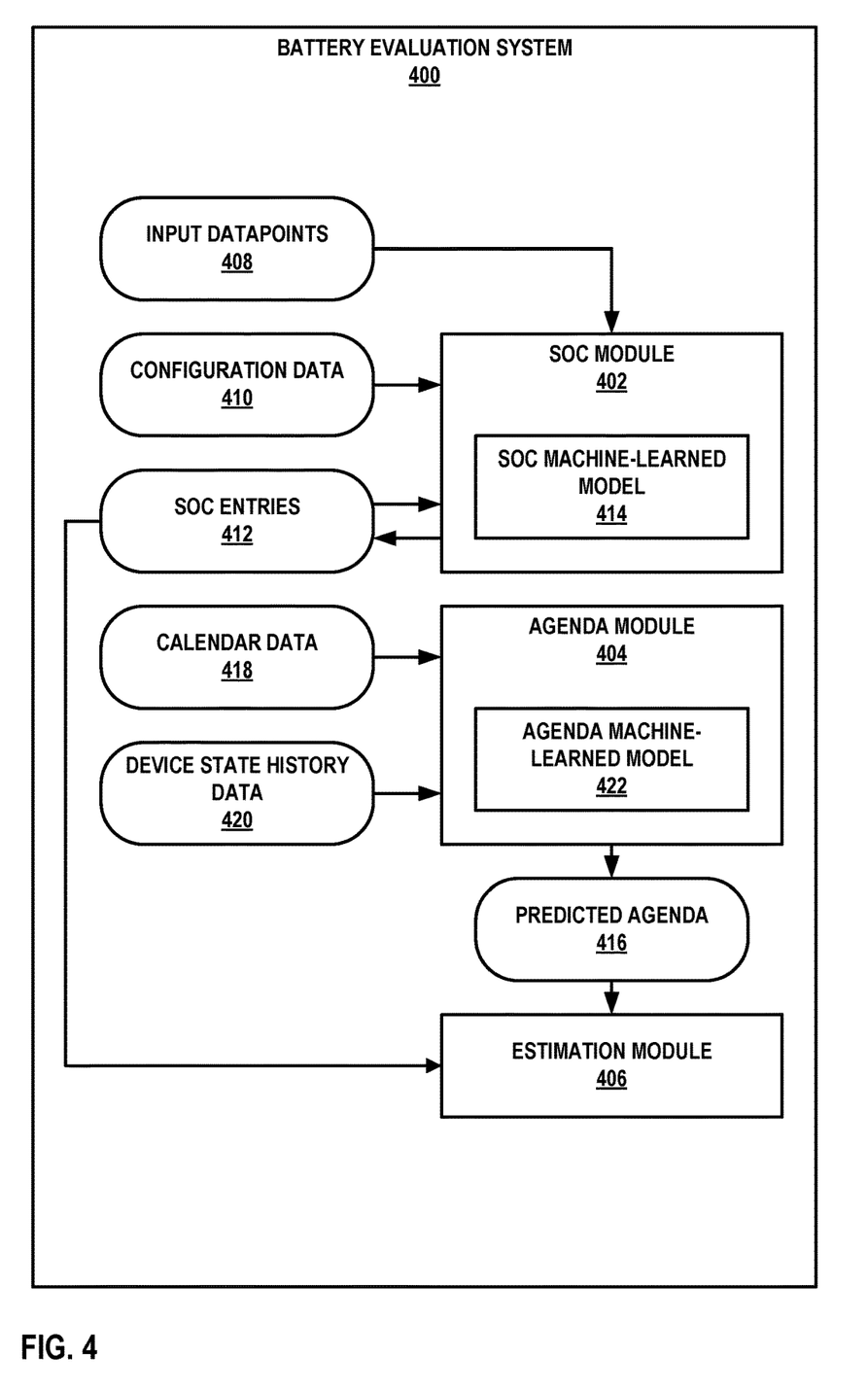
FIG. 4 is a block diagram illustrating example components of a battery evaluation system (BES), in accordance with one or more aspects of this disclosure.

FIG. 4 is a block diagram illustrating example components of a battery evaluation system (BES) 400, in accordance with one or more aspects of this disclosure. BES 400 may comprise a software system that provides functionality related to a battery (e.g., battery 116A, battery 116B, etc.) of a hearing instrument. Different parts of BES 400 may be executed on different processors of processing system 114. For example, different parts of BES 400 may be performed by processors 112A, processors 112B, and processors 112C. In another example, all parts of BES 400 may be performed by processors in a single device. For instance, in such examples, all parts of BES 400 may be performed by processors 112A, all parts of BES 400 may be performed by processors 112B, or all parts of BES 400 may be performed by processors 112C. In some examples, BES 400 may form part of companion application 324 (FIG. 3). In the example of FIG. 4, BES 400 is implemented in terms of a set of modules. However, in other examples, functionality of BES 400 may be implemented in a non-modular fashion or the functionality of BES 400 may be implemented using different sets of modules than shown in FIG. 4 and described in this disclosure. For ease of explanation, this disclosure refers to hearing instrument 102A and components thereof when describing BES 400. However, it will be appreciated that such discussion may be equally applicable to hearing instrument 102B and equivalent components thereof.

In the example of FIG. 4, BES 400 includes a SOC module 402, an agenda module 404, and an estimation module 406. SOC module 402 may determine a present SOC of battery 116A. Agenda module 404 may determine a predicted agenda for hearing instrument 102A. Estimation module 406 may estimate an amount of time remaining until a future SOC of battery 116A of hearing instrument 102A reaches a threshold. In other examples, BES 400 may be modularized in different ways. For instance, in some examples, agenda module 404 and estimation module 406 may be implemented as the same module.

In the example of FIG. 4, SOC module 402 may determine the present SOC of battery 116A based on a set of input datapoints 408. BES 400 may obtain input datapoints 408 in one of various ways. For instance, in some examples where computing system 106 implements BES 400, BES 400 may receive input datapoints 408 from hearing instrument 102A. That is, hearing instrument 102A may transmit input datapoints 408 to computing system 106 via a wired or wireless communication channel. In some examples, processors 112A of hearing instrument 102A implement SOC module 402 and processors 112A generate input datapoints 408.

BES 400 may obtain individual input datapoints 408 during use of hearing instrument 102A. For example, BES 400 may obtain individual datapoints 408 on a periodic basis (e.g., once every x number of minutes). In some examples, BES 400 may obtain individual datapoints 408 on an event-driven basis. For instance, in such examples, BES 400 may obtain an input datapoint in response to a change of a device state of hearing instrument 102A. In some examples, hearing instrument 102A generates the input datapoints and sends the input datapoints to a device that implements BES 400.

Input datapoints 408 may include various types of data that SOC module 402 may use to determine the SOC of battery 116A. For instance, in one example, each input datapoint may include:
  (i) a voltage reading indicating a voltage produced by battery 116A of hearing instrument 102A,
  (ii) device state data specifying a device state in a plurality of possible device states, and
  (iii) a timestamp indicating a time associated with the input datapoint In general, the voltage produced by battery 116A declines as the amount of dispatchable energy stored in battery 116A declines. In this example, the timestamp may indicate an absolute or relative time associated with the input datapoint. In other examples, input datapoints 408 may include more, fewer, or different data. For instance, input datapoints 408 may omit timestamps if input datapoints 408 are generated according to a predefined schedule or if such data is unnecessary. In some examples, an individual input datapoint may omit the device state data if the device state data is the same as the device state data of a previous input datapoint.

As noted above, an input datapoint may include device state data specifying a device state in a plurality of possible device states. The possible device states correspond to predefined states of hearing instrument 102A. In different device states, different parameters of hearing instrument 102A may have different values. Example parameters of hearing instrument 102A may include a volume level of speaker 108A, whether hearing instrument 102A is using a directional processing mode, whether hearing instrument 102A is streaming media, whether hearing instrument 102A is applying noise reduction, whether particular ones of sensors 212 (FIG. 2) of hearing instrument 102A are activated, a current clock rate of processors 112A, and so on.

Different device states may be associated with different amounts of power consumption. For example, hearing instrument 102A may consume more power from battery 116A when the volume level of speaker 108A is high than when the volume level of speaker 108A is low. Similarly, hearing instrument 102A may consume more power from battery 116A when hearing instrument 102A is using a directional processing mode than when hearing instrument 102A is not using the directional processing mode.

SOC module 402 may also use configuration data 410 to determine the present SOC of battery 116A of hearing instrument 102A. Configuration data 410 may include data indicating a configuration of hearing instrument 102A. For example, configuration data 410 may include data indicating a model of hearing instrument 102A, a version of the firmware used by hearing instrument 102A, a chipset used by hearing instrument 102A, and so on. In general, configuration data 410 does not change frequently, unlike input datapoints 408. Different configurations of hearing instruments may consume energy from batteries at different rates, even if the device states of the hearing instruments (e.g., output volume level, media streaming status, noise reduction status, etc.) are otherwise the same. In some examples, configuration data 410 may include data related to the age of battery 116A. For instance, configuration data 410 may include data indicating a date of manufacture of battery 116A, a number of charge cycles performed by battery 116A, and so on.

SOC module 402 may generate SOC entries 412. Each of SOC entries 412 maps a determined SOC of battery 116A to a voltage reading associated with the determined SOC of battery 116A. SOC module 402 may store SOC entries 412 for later use.

SOC module 402 may determine the present SOC of battery 116A of hearing instrument 102A based on a present input datapoint and one or more previous input datapoints. The present input datapoint and the one or more previous input datapoints are input datapoints in the set of input datapoints 408. The times associated with the one or more previous input datapoints are before the time associated with the present input datapoint. The future time segments of the predicted agenda for hearing instrument 102A may correspond to times after the time associated with the present input datapoint.

In some examples, to determine the present SOC of battery 116A of hearing instrument 102A based on the present input datapoint and the previous input datapoint, SOC module 402 may apply a SOC machine-learned model 414. SOC machine-learned model 414 may be implemented in one of a variety of ways. For instance, in one example, SOC machine-learned model 414 may be implemented using a digital artificial neural network (ANN). In this example, inputs to the ANN may include the present input datapoint (e.g., the current voltage, time, device state information, and/or configuration data) and a previous SOC of battery 116A. Outputs of the ANN may include the present SOC of battery 116A. The ANN may determine the previous SOC of battery 116A in the same way as the present SOC of battery 116A based on a previous input datapoint. In this example, the ANN may include one or more hidden layers of artificial neurons between an input layer of artificial neurons and an output layer of artificial neurons. The ANN may be implemented using one of various types of ANNs, such as a deep neural network, convolutional neural network, or other type of neural network.

In examples where SOC machine-learned model 414 is implemented using an ANN, the ANN may be trained in one of various ways. In some examples, BES 400 trains the ANN. In other examples, a computing system separate from a computing system that implements BES 400 trains the ANN. In some examples, to train the ANN, a set of training examples may be developed. Each of the training examples maps an input datapoint and a previous SOC value to a ground truth present SOC value such that the ANN model learns to predict the present ground truth present SOC. In this example, the input datapoint (which may also be known as a set of input features) may include the following: a current battery voltage and a current device state (e.g., streaming active/inactive, receiver output level, current clock rate of each chip). To determine the ground truth present SOC value for a training example, BES 400 adjusts weights within the neural network layers until the predicted SOC of the network output closely matches the ground truth present SOC value. BES 400 may measure the ground truth present SOC value associated with the input datapoint by calculating SOC remaining by subtracting the consumed charge from a total energy capacity of the battery and then dividing the result by the total energy capacity of the battery. Consumed charge can be calculated from a charge counter in a power source that is connected to battery 116A or battery 116B directly, or to battery circuitry supplying system power. In some examples, BES 400 calculates the consumed charge with an ammeter that measures current and then calculates the total charge consumed over a duration of time.

In some examples, SOC machine-learned model 414 is implemented using a set of regression models. The regression models may include a regression model for each combination of device state in the set of possible device states and configuration in a set of possible configurations. In such examples, each training datapoint for a regression model may include a voltage measurement and a time value. The voltage measurement of a training datapoint is a voltage measurement recorded by a hearing instrument that is in the device state and configuration corresponding to the regression model. The training datapoints may include a set of fully-charged training datapoints and a set of threshold-level training datapoints. Each of the fully-charged training datapoints records a voltage measurement when the battery is fully charged. Accordingly, the time for each of fully-charged training datapoints may be 0 and the SOC of the battery may be 100%.

Each of the threshold-level training datapoints records a voltage measurement and a time elapsed from the battery being fully charged to when the SOC of the battery reached the threshold while the hearing instrument was in the corresponding device state and configuration for the whole time. Thus, the SOC of the threshold-level training datapoints may be 0%. A regression may then be performed (e.g., by BES 400 or another program or computing device) using these training datapoints to determine a linear relationship between the voltage reading and time. The SOC can then be calculated from a voltage reading by using the linear relationship to determine a time corresponding to the voltage reading, and then dividing the determined time by an average of the elapsed times of the threshold-level training datapoints. In some examples, there may be different regression models for different battery ages, each of which may be trained with training datapoints for batteries of a different age. Thus, SOC module 402 may be able to determine the SOC of battery 116A based on part on the age of battery 116A.

In some examples, hearing instrument 102A includes a charge counter (which is also known as a Coulomb counter) that communicates indications of consumed energy to BES 400. The indications of consumed energy may be included in input datapoints 408. SOC module 402 may determine the SOC of battery 116A by subtracting the consumed charge from a total energy capacity of battery 116A and then dividing the result by the total energy capacity of battery 116A. The total energy of battery 116A may be initially set via configuration data 410. In some examples where a charge counter is used, SOC module 402 may directly determine the present SOC value and SOC machine-learned model 414 may be omitted from SOC module 402 or unused in SOC module 402.

In some examples, BES 400 performs a refinement method to refine the total energy capacity of battery 116A, e.g., after each charge cycle of battery 116A. The refinement method may calculate the total charge by counting the charge consumed between an observed maximum voltage of battery 116A and a minimum voltage of battery 116A. For instance, in some examples where battery 116A is a Lithium-Ion battery, the maximum voltage of battery 116A may be 4.2V and the minimum voltage of battery 116 may be 3.0V. SOC module 402 may use the determined total energy of battery 116A to predict the SOC during the next battery cycle. That is, during the next battery cycle of battery 116A, SOC module 402 may use the determined total energy of battery 116A as the total energy capacity of battery 116A. In this way, SOC module 402 may update how the SOC of battery 116A is determined as the total energy capacity of battery 116A decreases over time. In some examples, SOC module 402 uses a linear regression of the total charge cycles over time to predict the total usable lifetime of battery 116A in terms of charge cycles or alternatively, the total usable lifetime of the battery of a number of days or other unit.

As noted above, agenda module 404 may determine a predicted agenda 416 for hearing instrument 102A. Predicted agenda 416 for hearing instrument 102A comprises one or more future time segments. A future time segment is an amount of time occurring in the future. For example, predicted agenda 416 for hearing instrument 102A may comprise a first time segment for time $t_1$ to time $t_2$, a second time segment from time $t_2$ to time $t_3$, a third time segment from time $t_3$ to time $t_4$, and so on.

Each of the time segments of predicted agenda 416 may correspond to at least one device state in the plurality of possible device states. For example, a first time segment of predicted agenda 416 may correspond to a first device state, a second time segment of predicted agenda 416 may correspond to a second device state, a third time segment of predicted agenda 416 may correspond to the first device state again, a fourth time segment of predicted agenda 416 may correspond to a third device state, and so on. For instance, in this example, the first time segment may correspond to a device state in which hearing instrument 102A is wirelessly streaming media data and has first output volume level, the second time segment may correspond to a device state in which hearing instrument 102A is not streaming media data and has the first output volume level, and the third time segment may correspond to a device state in which hearing instrument 102A is not streaming media data and has a second output volume level.

Agenda module 404 may use various types of data to determine predicted agenda 416 for hearing instrument 102A. In the example of FIG. 4, agenda module 404 may use calendar data 418 and/or device state history data 420 to determine predicted agenda 416 for hearing instrument 102A. Calendar data 418 may include data from a calendar of user 104. The data from the calendar of user 104 may include items such as appointments, travel plans, planned meetings, planned recreational activities, and/or other events or activities that may potentially impact which device state hearing instrument 102A will be in and how much time hearing instrument 102A will be in such device states. For example, calendar data 418 may include an item indicating that user 104 is planning to be on a flight for a given amount of time. In this example, during the flight, hearing instrument 102A may be in a device state in which hearing instrument 102 uses noise reduction and an increased output volume to counter the noise of the airplane.

Device state history data 420 may include information about past device states of hearing instrument 102A. Agenda module 404 may analyze device state history data 420 to identify temporal patterns of device states. For example, agenda module 404 may analyze device state history data 420 to determine that hearing instrument 102A typically streams audio data from 5:30 μm to 6:00 pm on weekdays (e.g., because user 104 likes to stream audio data during their commute). In another example, agenda module 404 may analyze device state history data 420 to determine that hearing instrument 102A typically has an increased output volume level on Friday evenings (e.g., because user 104 frequently goes to loud restaurants on Friday evenings). In some examples, agenda module 404 may assume that hearing instrument 102A is in a default device state for times that are not associated with a calendar event or for which a device state has not been identified based on device state history data 420.

In the example of FIG. 4, agenda module 404 may apply an agenda machine-learned model 422 to determine the predicted agenda for hearing instrument 102A. Agenda machine-learned model 422 may be implemented in one of various ways. For instance, in one example, agenda machine-learned model 422 may divide a time period (e.g., 1 week) into a set of time segments (e.g., 5-minute time segments). In this example, for each time slot, agenda machine-learned model 422 records the actual device state of hearing instrument 102A during the time period (e.g., as part of device state history data 420). Thus, over the course of several time periods, agenda machine-learned model 422 may generate statistics regarding the device states for each of the time segments. In other words, agenda machine-learned model 422 may learn what device states are most likely at different times. For example, agenda machine-learned model 422 may determine that device state x is the most likely device state for the time segment from 5:00 μm to 5:05 pm on Thursdays, that device state y is the most likely device state for the time segment from 5:05 μm to 5:10 pm on Thursdays, and so on. Thus, agenda machine-learned model 422 may determine the predicted agenda for hearing instrument 102 as the most likely device states for the time segments in an upcoming time period.

In this example, device state history data 420 may include statistics associated with different types of events that may occur in calendar data 418. For example, the types of events that may occur in calendar data 418 may include a plane trip and a telephone meeting. In this example, device state history data 420 may include data including a likelihood that hearing instrument 102A is in device state x when user 104 is on a plane trip and may include data indicating a likelihood that hearing instrument 102A is in device state y when user 104 is in a telephone meeting. Thus, when calendar data 418 indicates that a specific type of event will occur at a specific time period in the future, agenda machine-learned model 422 may use the statistics associated with the specific type of event when formulating the portion of the agenda for the specific time period.

Thus, based on device state history data 420 and/or calendar data 418, processing system 118 may determine likelihoods of the possible device states for the future time segments. Processing system 114 may determine, based on the likelihoods of the possible device states for the future time segments, the device states corresponding to the future time segments in the predicted agenda.

As noted above, estimation module 406 may estimate, based on the present SOC of battery 116 and predicted agenda 416, an amount of time remaining until a future SOC of battery 116A of hearing instrument 102A reaches a threshold. In different examples, the threshold may be defined in one of a plurality of different ways. For instance, in some examples, the threshold may be a threshold below which battery 116A no longer has enough dispatchable energy to power hearing instrument 102A. In some examples, the threshold may be a warning threshold below which a warning is generated (e.g., by hearing instrument 102A, computing system 106, etc.) notifying user 104 that battery 116A has low remaining power. In some examples, the threshold is user-configurable. In some examples, the threshold is set by a manufacturer or other party. In some examples, the threshold is set by a component or software system. In some examples, the threshold is set via configuration data 410. In other examples, the threshold is unchangeable.

In some examples, to estimate the amount of time remaining until the future SOC of battery 116A reaches the threshold, estimation module 406 may determine a future SOC function that is continuous and monotonic. The future SOC function comprises, for each respective future time segment in predicted agenda 416, a respective function segment having a curve associated with the device state corresponding to the respective future time segment. In this example, an initial value of the future SOC function is based on the present SOC of battery 116A. Estimation module 406 may estimate, based on the future SOC function, an amount of time remaining until the future SOC of battery 116A of hearing instrument 102A reaches the threshold.

Figure 5:
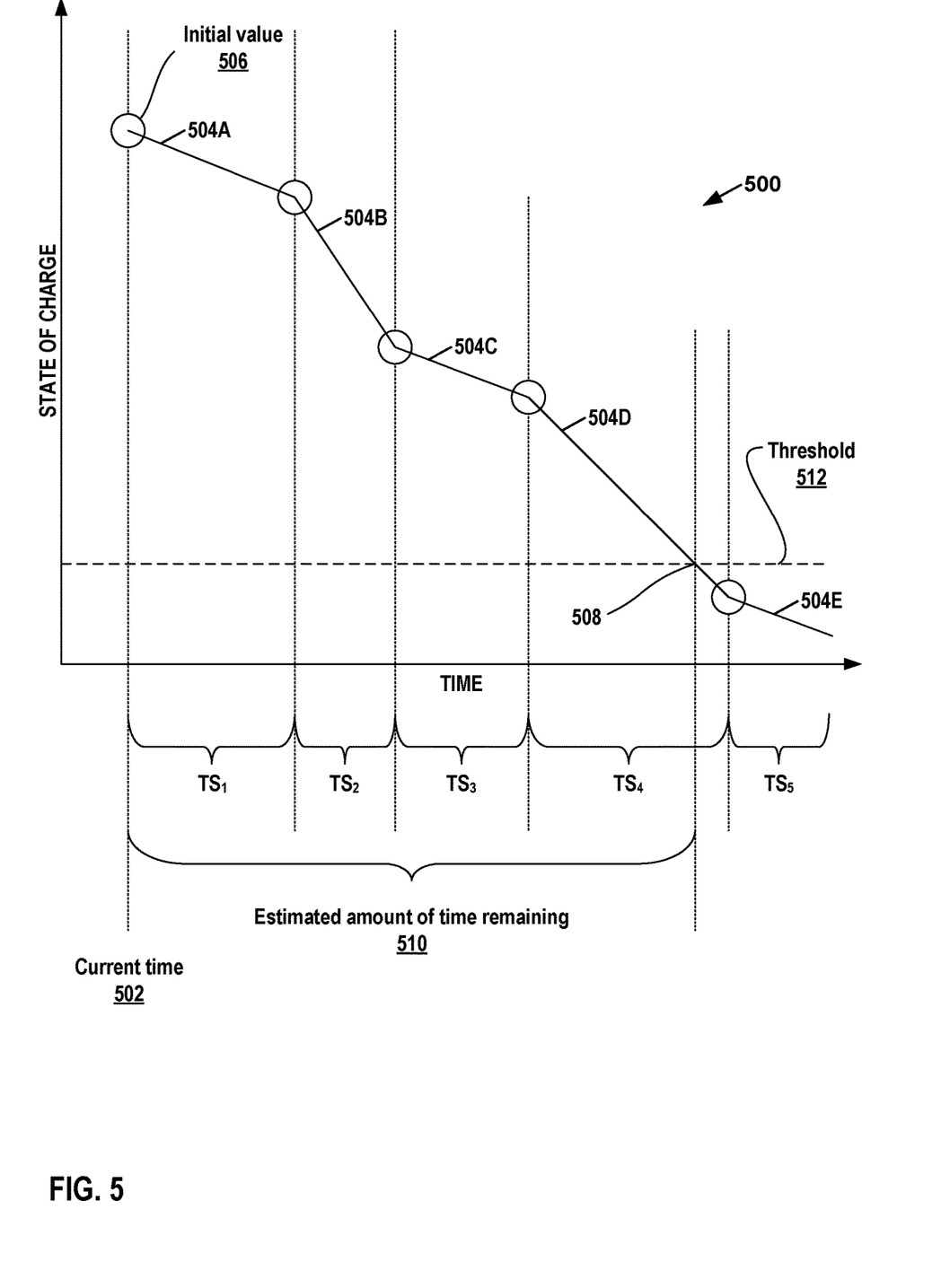
FIG. 5 is a conceptual diagram illustrating an example future state of charge (SOC) function, in accordance with one or more aspects of this disclosure.

FIG. 5 is a conceptual diagram illustrating an example future SOC function 500, in accordance with one or more aspects of this disclosure. In the example of FIG. 5, future SOC function 500 is presented on a vertical axis corresponding to future SOC values of battery 116A and a horizontal axis corresponding to time. Line 502 corresponds to the current time (i.e., the time associated with the present SOC of battery 116A). Furthermore, as shown in the example of FIG. 5, future SOC function 500 may be monotonic (decreasing) and continuous (no breaks).

In the example of FIG. 5, predicted agenda 416 may include five time segments, each of which may correspond to a device state of hearing instrument 102A. In the example of FIG. 5, the five time segments are labeled $TS_1$, $TS_2$, $TS_3$, $TS_4$, and $TS_5$. For each respective future time segment in predicted agenda 416, future SOC function 500 includes a respective function segment (i.e., function segment 504A corresponding to $TS_1$, function segment 504B corresponding to $TS_2$, function segment 504C corresponding to $TS_3$, function segment 504D corresponding to $TS_4$, and function segment 504E corresponding to $TS_5$). This disclosure may refer to function segments 504A, 504B, 504C, 504D, and 504E as "function segments 504."

Each of function segments 504 has a curve associated with the device state corresponding to the respective future time segment. In this context, a curve may be a straight or non-straight line. The slope and/or other aspects of the curve associated with a device state may be associated with an amount of power consumed from battery 116A by hearing instrument 102A while hearing instrument 102A is in the device state. For instance, in the example of FIG. 5, hearing instrument 102A consumes power from battery 116A at a faster rate when hearing instrument 102A is in the device state corresponding to $TS_2$ than when hearing instrument 102A is in the device state corresponding to $TS_3$. A curve associated with a device state may correspond to the slope determined by SOC module 402 for the device state.

Furthermore, as shown in the example of FIG. 5, an initial value 506 of future SOC function 500 is based on the present SOC. By determining the curve associated with the device state corresponding to time segment $TS_1$, processing system 114 may determine a predicted future SOC of battery 116A at the end of time segment $TS_1$. The predicted future SOC of battery 116A at the end of time segment $TS_1$ is the initial SOC of battery 116A at the beginning of time segment $TS_2$. By determining the curve associated with the device state corresponding to time segment $TS_2$, processing system 114 may determine a predicted future SOC of battery 116A at the end of time segment $TS_2$. The predicted future SOC of battery 116A at the end of time segment $TS_2$ is the initial SOC of battery 116A at the beginning of time segment $TS_3$, and so on. In this way, processing system 114 may determine future SOC function 500 by concatenating function segments.

In some examples, predicted agenda 416 may specify probabilities of device states for future time periods. In other words, predicted agenda 416 may comprise future time segments corresponding to a set of device states along with probabilities for those device states. In such examples, the future time segments may be of equal duration and, for each of the time segments, estimation module 406 may determine a function segment for the time segment as a weighted average of the curves associated with the possible device states based on the probabilities of the device states. For example, a slope of a curve for device state x may be −1 and a probability of hearing instrument 102A being in device state x during time period $t_1 \ldots t_2$ may be 0.75. Furthermore, in the example, if a slope of a curve for device state y is −2 and a probability of hearing instrument 102A being in device state y during time period $t_1 \ldots t_2$ is 0.25, estimation module 406 may determine that the slope of the curve for time period $t_1 \ldots t_2$ is −1.25.

The example of FIG. 5 represents a threshold 512 as a horizontal line corresponding to a specific SOC of battery 116A. Processing system 114 may use future SOC function 500 to estimate an amount of time remaining until the future SOC of battery 116A reaches threshold 512. For instance, processing system 114 may determine a point 508 at which future SOC function 500 intercepts threshold 512. Processing system 114 may then determine an estimated amount of time 510 as a difference between current time 502 and the time associated with point 508.

In some examples, BES 400 may determine a plurality of hypothetical future SOC functions and use the hypothetical future SOC functions to estimate amounts of time remaining until the future SOC of battery 116A of hearing instrument 102A reaches the threshold. BES 400 may use a plurality of predicted agendas to determine the hypothetical future SOC functions. Additionally, BES 400 may estimate a plurality of amounts of time remaining until the future SOC of the battery 116A reaches the threshold using different predicted timelines. In the different predicted timelines, hearing instrument 102A may have different device states and/or different device states may persist for different lengths of time. BES 400 may then determine the amount of time remaining until the future SOC of battery 116A reaches the threshold based on estimates of the time remaining until the future SOC of battery 116A reaches the threshold, e.g., by in one example, forming a weighted averaging the predicted amounts of time, where the amounts of time are weighted according to probabilities of the predicted timelines associated with the predicted times. In this example, BES 400 may determine the probabilities of the predicted timelines based on past device states and lengths of time in those states. In some examples, BES 400 uses only the predicted amount of time of the most probable predicted timeline as the estimated amount of time remaining until the future SOC of battery 116A reaches the threshold.

Furthermore, in some examples, BES 400 may enable a user (e.g., user 104 or another person) to review estimated times remaining until the future SOC of battery 116A reaches the threshold for multiple potential agendas of hearing instrument 102A. For example, BES 400 may output, for audio and/or visual presentation to the user, a set of options for review by the user along with corresponding estimated amounts of time remaining until the future SOC of battery 116A reaches the threshold. The different options may correspond to different agendas for hearing instrument 102A. For example, a first option may involve hearing instrument 102A being in a set of one or more device states associated with a high level of feature richness and a high level of power consumption, a second option may involve hearing instrument 102A being in a set of one or more device states that involve a medium level of feature richness and a medium level of power consumption, and a third option may involve hearing instrument 102A being in a series of one or more device states that involve a low level of feature richness and a relatively low level of power consumption. For instance, in this example, the first option may involve hearing instrument 102A running a full suite of sensors (e.g., a PPG sensor, an EEG sensor, an IMU, etc.), the second option may involve hearing instrument 102A running a limited suite of sensors (e.g., only an IMU), and the third option may involve hearing instrument 102A running none of the sensors.

Furthermore, BES 400 may update a configuration of hearing instrument 102A in response to receiving an indication of user input to select one of the options. For instance, in the example of the previous paragraph, BES 400 may receive an indication of user input to select the second option. In response to receiving the indication of user input to select the second option, BES 400 may turn off the full suite of sensors and instead run the limited suite of sensors. In this way, the user may be able to review options and determine which option to select based on the user's required operating time for hearing instrument 102A. For example, the future SOC of battery 116A may reach the threshold in 3 hours when using the first option, 5 hours when using the second option, and 7 hours when using the third option. In this example, if the user needs to keep using hearing instrument for at least 4 more hours, the user may select the second or third options.

Figure 6:
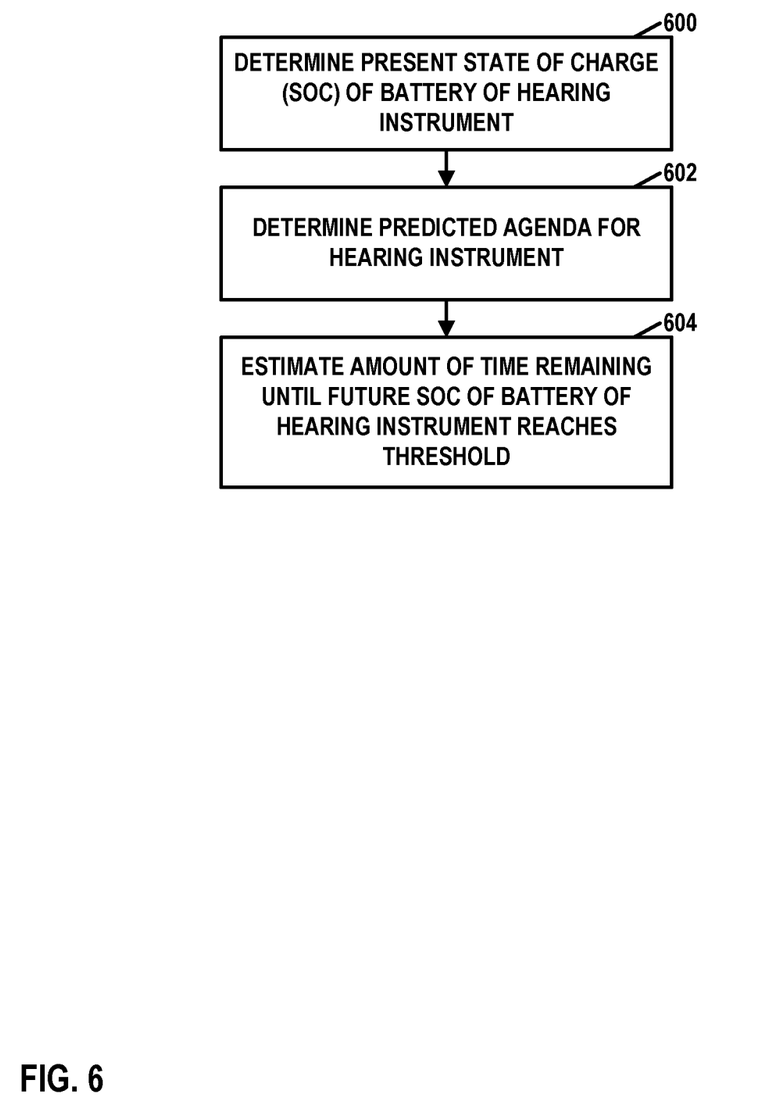
FIG. 6 is a flowchart illustrating example operation in accordance with an example of this disclosure.

FIG. 6 is a flowchart illustrating an example operation 600 of this disclosure. Other examples of this disclosure may include more, fewer, or different actions. Moreover, the example of FIG. 6 is described with respect to hearing instrument 102A and components thereof, but may be equally applicable to hearing instrument 102B and components of hearing instrument 102B.

In the example of FIG. 6, processing system 114 determines, based on a set of input datapoints, a present SOC of battery 116A of hearing instrument 102A (600). Processing system 114 may determine the present SOC of battery 116A according to any of the examples provided elsewhere in this disclosure.

Furthermore, in the example of FIG. 6, processing system 114 may determine a predicted agenda for hearing instrument 102A (602). The predicted agenda comprises one or more future time segments and each of the future time segments corresponds to a device state of the hearing instrument in a plurality of possible device states. Processing system 114 may determine the predicted agenda for hearing instrument 102A according to any of the examples provided elsewhere in this disclosure.

Processing system 114 may also estimate, based on the current state of charge and the predicted agenda, an amount of time remaining until a future SOC of battery 116A of hearing instrument 102A reaches a threshold (604). Processing system 114 may estimate the amount of time remaining until the future SOC of battery 116A reaches the threshold according to any of the examples provided elsewhere in this disclosure.

In some examples, processing system 114 may output for presentation to user 104 of hearing instrument 102A, the estimated amount of time remaining until the future SOC of battery 116A reaches the threshold. For example, processing system 114 may cause hearing instrument 102A to output an audible indication of the estimated amount of time. In some examples, processing system 114 may cause a display screen (e.g., display screen 312 (FIG. 3)) to show a visible indication of the estimated amount of time. Example types of visible information may include one or more of numerical and/or textual data indicating the estimated amount of time, a bar having a length corresponding to the estimated amount of time, a battery icon filled to a level corresponding to the estimated amount of time, or other types of visible indicators of the estimated amount of time. In some examples, the estimated amount of time may be presented by a device for use by a person other than user 104, such as a caregiver, family member, or other type of person.

Although the techniques of this disclosure have been described with respect to hearing instruments, the techniques of this disclosure may be applicable to other devices of devices that include batteries, such as accessory devices for hearing instruments.

In this disclosure, ordinal terms such as "first," "second," "third," and so on, are not necessarily indicators of positions within an order, but rather may be used to distinguish different instances of the same thing. Examples provided in this disclosure may be used together, separately, or in various combinations. Furthermore, with respect to examples that involve personal data regarding a user, it may be required that such personal data only be used with the permission of the user.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processing circuits to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, cache memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Functionality described in this disclosure may be performed by fixed function and/or programmable processing circuitry. For instance, instructions may be executed by fixed function and/or programmable processing circuitry, such as circuitry implementing processing system 114. Such processing circuitry may include one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements. Processing circuits may be coupled to other components in various ways. For example, a processing circuit may be coupled to other components via an internal device interconnect, a wired or wireless network connection, or another communication medium.

The techniques of this disclosure may be implemented in a wide variety of devices or apparatuses, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

What is claimed is:

1. A method comprising:
determining, by a processing system, a plurality of hypothetical future state of charge (SOC) functions, each of the hypothetical future SOC functions corresponding to a respective predicted timeline in which a hearing instrument has at least one of: different device states or different durations of the device states;
estimating, by the processing system, a plurality of preliminary amounts of time remaining until a future SOC of a battery of the hearing instrument reaches a threshold using the plurality of hypothetical future SOC functions; and
determining, by the processing system, based on the plurality of preliminary amounts of time remaining, a final amount of time remaining until the future SOC of the battery reaches the threshold.

2. The method of claim 1, wherein determining the final amount of time remaining comprises determining, by the processing system, the final amount of time remaining based on a weighted average of the preliminary amounts of time remaining, wherein the preliminary amounts of time remaining are weighted according to probabilities associated with the predicted timelines.

3. The method of claim 2, further comprising determining, by the processing system, the probabilities associated with the predicted timelines based on past device states and lengths of time in the past device states.

4. The method of claim 1, wherein determining the final amount of time remaining comprises determining, by the processing system, that the final amount of time remaining is the preliminary amount of time remaining until the future SOC of the battery reaches the threshold using a hypothetical SOC function of the plurality of hypothetical SOC functions corresponding to one of the predicted timelines that has a highest probability.

5. The method of claim 1, wherein:
the method further comprises:
obtaining, by the processing system, a set of input datapoints, each input datapoint in the set of input datapoints including:
(i) a voltage reading indicating a voltage produced by the battery, and
(ii) device state data specifying a device state in a plurality of possible device states, and
determining, by the processing system, a present SOC of the battery based on a present input datapoint and a previous input datapoint, wherein the present input datapoint and the previous input datapoint are input datapoints in the set of input datapoints and a time associated with the previous input datapoint is before a time associated with the present input datapoint,
estimating the plurality of preliminary amounts of time remaining comprises estimating, by the processing system, the plurality of preliminary amounts of time remaining based on the present SOC and the plurality of hypothetical future SOC functions.

6. The method of claim 1, wherein determining the plurality of hypothetical future SOC functions comprises, for at least one of the hypothetical future SOC functions:
determining, by the processing system, a predicted agenda for the hearing instrument, wherein the predicted agenda comprises one or more future time segments and each of the future time segments corresponds to a device state of the hearing instrument in a plurality of possible device states.

7. The method of claim 6, wherein the at least one hypothetical future SOC function is continuous and monotonic, and comprises, for each respective future time segment in the predicted agenda, a respective function segment having a curve associated with the device state corresponding to the respective future time segment, wherein an initial value of the future SOC function is based on a present SOC.

8. The method of claim 6, wherein the predicted agenda includes a plurality of time segments.

9. The method of claim 6, wherein determining the predicted agenda comprises determining, by the processing system, the predicted agenda based at least in part on calendar data for a user of the hearing instrument.

10. The method of claim 6, wherein determining the predicted agenda comprises determining, by the processing system, the predicted agenda based at least in part on device state history data that include information regarding past device states of the hearing instrument.

11. The method of claim 10, wherein determining the predicted agenda comprises:
determining, by the processing system, based on the device state history data, likelihoods of the possible device states for the future time segments; and
determining, by the processing system, based on the likelihoods of the possible device states for the future time segments, the device states corresponding to the future time segments in the predicted agenda.

12. The method of claim 1, further comprising:
outputting, by the processing system, for presentation to a user of the hearing instrument, the final amount of time remaining until the future SOC of the battery reaches the threshold.

13. A system comprising:
a hearing instrument comprising a battery; and
a processing system configured to:
determine a plurality of hypothetical future state of charge (SOC) functions, each of the hypothetical future SOC functions corresponding to a respective predicted timeline in which the hearing instrument has at least one of: different device states or different durations of the device states;
estimate a plurality of preliminary amounts of time remaining until a future SOC of a battery of the hearing instrument reaches a threshold using the plurality of hypothetical future SOC functions; and
determine, based on the plurality of preliminary amounts of time remaining, a final amount of time remaining until the future SOC of the battery reaches the threshold.

14. The system of claim 13, wherein the processing system is configured to, as part of determining the final amount of time remaining, determine the final amount of time remaining based on a weighted average of the preliminary amounts of time remaining, wherein the preliminary amounts of time remaining are weighted according to probabilities associated with the predicted timelines.

15. The system of claim 14, wherein the processing system is further configured to determine the probabilities associated with the predicted timelines based on past device states and lengths of time in the past device states.

16. The system of claim 13, wherein the processing system is configured to, as part of determining the final amount of time remaining, determine that the final amount of time remaining is the preliminary amount of time remaining until the future SOC of the battery reaches the threshold using a hypothetical SOC function of the plurality of hypothetical SOC functions corresponding to one of the predicted timelines that has a highest probability.

17. The system of claim 13, wherein:
the processing system is configured to obtain a set of input datapoints, each input datapoint in the set of input datapoints including:
(i) a voltage reading indicating a voltage produced by the battery, and
(ii) device state data specifying a device state in a plurality of possible device states, and
wherein the processing system is configured to determine a present SOC of the battery of the hearing instrument based on a present input datapoint and a previous input datapoint, wherein the present input datapoint and the previous input datapoint are input datapoints in the set of input datapoints and a time associated with the previous input datapoint is before a time associated with the present input datapoint, and
the processing system is configured to estimate the plurality of preliminary amounts of time remaining based on the present SOC and the plurality of hypothetical future SOC functions.

18. The system of claim 13, wherein the processing system is configured to, as part of determining the plurality of hypothetical future SOC functions, for at least one of the hypothetical future SOC functions:
determine a predicted agenda for the hearing instrument, wherein the predicted agenda comprises one or more future time segments and each of the future time segments corresponds to a device state of the hearing instrument in a plurality of possible device states.

19. The system of claim 18, wherein the at least one hypothetical future SOC function is continuous and monotonic, and comprises, for each respective future time segment in the predicted agenda, a respective function segment having a curve associated with the device state corresponding to the respective future time segment, wherein an initial value of the future SOC function is based on a present SOC.

20. The system of claim 18, wherein the processing system is configured such that, as part of determining the predicted agenda, the processing system determines the predicted agenda based at least in part on device state history data that include information regarding past device states of the hearing instrument.

* * * * *